United States Patent [19]

Fanger et al.

[11] 4,221,859
[45] Sep. 9, 1980

[54] PHOTOPOLYMERIZABLE COMPOSITION WITH OXALIC ACID PHOTOINITIATOR

[75] Inventors: Gene O. Fanger, Muncie; George W. Brutchen, Winchester, both of Ind.

[73] Assignee: Ball Corporation, Muncie, Ind.

[21] Appl. No.: 683,439

[22] Filed: May 4, 1976

Related U.S. Application Data

[63] Continuation-in-part of Ser. No. 540,486, Jan. 13, 1975, abandoned.

[51] Int. Cl.² ............................................. G03C 1/68
[52] U.S. Cl. .............................. 430/285; 204/159.23; 430/286; 430/906; 430/909; 430/911; 430/913; 430/923; 430/927; 430/306
[58] Field of Search ..................... 96/115 P, 115 R; 204/159.23

[56] References Cited

U.S. PATENT DOCUMENTS

| | | | |
|---|---|---|---|
| 3,388,995 | 6/1965 | Schwerin et al. | 96/86 |
| 3,418,118 | 12/1968 | Thommes et al. | 96/11 |
| 3,718,973 | 2/1973 | Geruay et al. | 96/115 P |
| 3,740,224 | 6/1973 | Barzynski et al. | 96/115 P |
| 3,879,204 | 4/1975 | Geruay | 96/115 P |

*Primary Examiner*—Edward C. Kimlin
*Attorney, Agent, or Firm*—Gilbert E. Alberding

[57] ABSTRACT

The subject invention relates to photopolymerizable compositions useful for making plastic printing elements for use in photolithography and other photomechanical processes. The photopolymerizable compositions comprise an aqueous mixture of a water-insoluble resin, a water-soluble binder, a crosslinking agent, and a photopolymerization initiator having an alpha-keto ester linkage. In particular, photopolymerization initiators include oxalic acid, sodium oxalate, potassium oxalate, lithium oxalate and urea oxalate. The printing plates prepared from the compositions herein disclosed have improved ink receptivity, good retention of such ink, receptivity even after long continued use, greater durability and excellent binding qualities.

9 Claims, No Drawings

PHOTOPOLYMERIZABLE COMPOSITION WITH OXALIC ACID PHOTOINITIATOR

BACKGROUND OF THE INVENTION

The present application is a continuation-in-part of our copending, commonly assigned patent application, Ser. No. 540,486 filed Jan. 13, 1975 now abandoned.

This invention relates generally to a new photopolymerizable composition for use in photolithography and photomechanical processes, and more particularly to an inherently light sensitive photopolymerizable composition for such use.

Printing plates having photopolymerizable compositions coated thereon are well-known in the art and have become more popular in the printing industry. The compositions themselves generally comprise a colloidal layer of arabic gum or other similar material containing a photosensitive hardening agent such as a bichromate salt. As of late, the use of light sensitive diazo compounds have made substantial impact upon the printing industry. At any rate, the bichromated colloid as well as the diazo compounds have several material disadvantages which restrict their application and use. One such inherent disadvantage of the bichromated colloids is that they deteriorate relatively rapidly after coating, thus making them unsuitable for use when long shelf life is desired. Moreover, many of the colloidal light sensitive materials presently employed have photopolymerizable compositions requiring relatively high temperature oven bake after exposure and development but prior to use, thereby increasing the overall cost and complicating the process of preparation. As regards the diazo compounds, they seemingly have a tendency to decompose chemically upon contact with a metal surface. Consequently, when a diazo compound is to be used over a metal plate, an intervening protective sublayer must be used. It is known that if the sublayer is not properly formed, the resulting lithographic plate may be defective or have a short storage life.

Plates having photopolymerizable compositions coated thereon are processed by exposing imagewise such compositions to actinic radiation whereby certain photoinitiators incorporated therein become activated and induce the polymerization of the materials. Thus, an exposed coated plate results in polymerized and unpolymerized areas in imagewise distribution corresponding to the light and dark areas, respectively, of a master used for the exposure. It is known that the exposed plate may be used in a variety of ways. For example, treatment with a suitable solvent that dissolves the unpolymerized material, but not the polymer results in a relief plate; proper selection of monomer and other ingredients gives a transfer element the unpolymerized areas of which can be transferred to a separate receptor sheet; the ingredients can be chosen so that either the polymerized or the unpolymerized areas are selectively ink receptive, thus giving an element useful for positive or negative offset printing.

One important application of photopolymerizable printing plates is in letter press printing. As is known, letterpress printing is one in which raised inked surfaces come in direct contact with the substrate, such as paper and the impression or image is transferred. Here the relief plates must "read wrong" because the impression on the substrate or stock, which must "read right" comes in direct contact with the relief plate. These treated plates require a relief-image, the raised areas of which are capable of being suitably inked by various means and pressed against a working surface, e.g., a sheet of paper, thus giving a print. The wide commercial acceptance of these printing plates has resulted primarily from their ease of formation and the fine print quality resulting therefrom. Further, it has been found that such printing plates have a press life comparable to the much more expensive metal plates, such as zinc and magnesium.

Although the amount of relief can be adequately controlled, there are certain preferred ranges which give best results under commercial operation. To be used in original printing presses the relief thickness of the printing plate generally is from about 0.015 to about 0.040 inch deep. Generally, this depth is required in order to prevent large non-printing areas from picking up any ink and transferring it to a receiving substrate. The printing surface can generally be described as a combination of halftone dots and solid relief portions comprising a multiplicity of minute wells. The former being the highlight halftone areas, the latter being the shadow areas. In small non-printing areas, e.g., the small ink collecting areas or wells in the shadow areas, the relief is considerably shallower, of the order of about 0.004 to about 0.008 inch whereas in the highly halftone area, the relief is in the order of about 0.012 to about 0.038.

Because of the use of precision printing presses in which the inking operation of a plate is performed accurately there is less requirement that the relief height be very great. That is to say that precision printing presses do not require the height necessary associated with ordinary presses and can utilize much thinner printing plates. Further, the so-called dry-off set process requires only a normal relief and thus a very thin printing plate can be utilized.

The commercially available printing plate utilizing photopolymerizable compositions has many advantages in that they can be readily prepared, that the images produced thereon show good resolution and remarkably sharp detail, and that the materials used when discarded are less harsh upon the ecology. Nevertheless, the commercially available plate has certain disadvantages in that the starting photopolymerizable compositions are generally expensive, that special organic chemicals are needed for washing out these plates, and that the handling of these plates require an environment from which ultraviolet rays are totally excluded. In contrast to the now available printing plates, the photopolymerizable compositions described herein retain the advantages of the printing characteristics of the conventional plates, but have added advantages in that the compositions are relatively inexpensive, can be washed with ordinary tap water, have enhanced storage or shelf life without special safeguards, and can be used in a wide range of applications.

SUMMARY OF THE INVENTION

Briefly, in accordance with this invention, a photopolymerizable composition is disclosed comprising an aqueous mixture of a water-insoluble resin, a water-soluble binder, a crosslinking agent, and an alpha-keto ester initiator.

An object of this invention is to provide new and practical photosensitive elements. Another object is to provide such elements that are simple, inexpensive and dependable. A further object is to provide for utilizing certain compositions containing oxalic acid and its derivatives in the preparation of compositions for printing plates.

The water-insoluble resins usable in the compositions referred to herein denote generally those polymers in which there are vinyl esters, especially vinyl acetate monomers incorporated in the polymeric chain. All polyvinyl ester polymers or polymers formed by condensation of aceteldehyde or any other aldehyde with polyvinyl alcohol or any polymer or copolymers of the acetal group may be used as the water-insoluble resins. The vinyl esters may be copolymerized with any of the known photopolymerizable organic vinyl compounds, i.e., compounds containing a single $H_2C=C<$ group as the sole site of additional polymerization. Typically suitable monomers include acrylyl and alkacrylyl compounds, e.g., acrylic, haloacrylic, and methacrylic acids, esters, nitriles and amides such as acrylonitrile, methyl methacrylate, ethyl methacrylate, butyl methacryate, octyl methacrylate, cyclohexyl metacrylate, methoxymethyl methacrylate, chloroethyl methacrylate, methacrylic acid, ethylacrylate, calcium acrylate, and alpha chloroacrylic acid, vinyl and vinylidene chloride, vinylidene fluoride, vinyl carboxylates, N-vinyl imides such as N-vinyl phthalimide and N-vinyl succinimide, N-vinyl lactams such as N-vinyl caprolactam, vinylaryls such as styrene and other vinyl derivatives including vinyl pyrrolidone. Further, copolymers of methylacrylate or ethylacrylate with up to about 30 or more by weight of acrylonitrile are suitable water-insoluble polymers for the mixtures herein disclosed. Mixtures of any two or more of the above mentioned monomers may also be utilized. It should be pointed out that these water-insoluble resins assume a form or configuration in an amulsion of that of a sphere, spheroid, lenticular shape, etc., while being surrounded by a water-soluble matrix or layer of an organic binder material to be hereinafter described.

The water-soluble binders useful herein include the synthetic and natural binders, preferably polyvinyl alcohol or copolymers containing vinyl alcohol units. Another very useful binder is polyvinyl pyrrolidone. Generally, polyvinyls are preferable in view of their ease in coating. As for the polyvinyl alcohol it may be conventionally produced via alcoholysis of polymerizable acetate with methanol. Any other unit of polymerizable monomers, especially vinyl polymers, may be present as non-reactive polymer components in the copolymer, for instance, units of ethylene, propylene, butylene, butadiene, isoprene, vinyl chloride, vinylidene chloride, vinyl ester, partially hydrolyzed vinyl acetate and vinyl propionate, vinyl ether, for instance, vinyl propyl ether, vinyl isobutyl ether, acrylic or methacrylic acid, or derivatives thereof, such as esters, particularly those obtained with alphatic alcohols containing at most five carbon atoms, acrylonitrile, methacrylonitrile, butadiene, maleic anhydride, styrene, and so on. Also suitable as water-soluble binders are the natural polymers including cellulose, starch, and gelatin, or modified derivatives thereof, e.g., carboxy methylcellulose, of these natural substances such as, for an example, partly esterified or etherified cellulose. Generally, the binders are water-soluble or materials having hydrophilic properties, such materials being easily washed out or dissolved by suitable developing solution in accordance with the methods disclosed herein.

The water-insoluble polymers in conjunction with the binders described herein form emulsions; thus, when placed in contact with a binder such polyvinyl alcohols form a coating of polyvinyl alcohol around individual particles of the polymer, through which the polymer particles are prevented from being joined with polymer particles proximate thereto when the emulsion is dried to form a coating. Seemingly, the polyvinyl alcohol serves as a dispersant or coating agent upon the polymer particles, and maintains the particles from one another. If no polyvinyl alcohol was added to the polymer, then the polymer particle would have the tendency to be joined together upon drying and the film produced would be insoluble in water.

The crosslinking agents used in conjunction with the subject invention include those molecules in which there is a terminal vinyl group, amide group or amine group. A good crosslinking agent is acrylamide or methacrylamide.

The aminimides may also serve as crosslinking agents and are a group of water-soluble compounds that are isocyanate precursors having a dipolar ion characteristic which seemingly contributes to their solubility and neutrality. The aminimides useful in the compositions herein disclosed include the following:

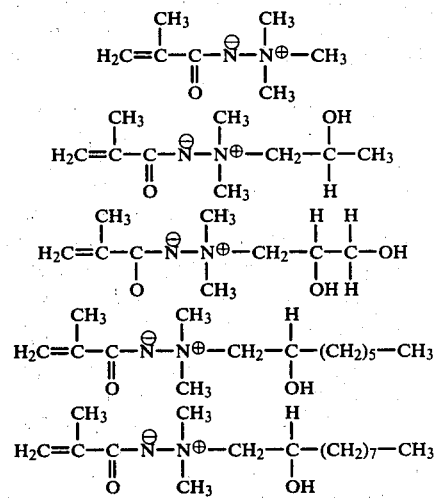

Other suitable crosslinking agents include the acrylamides which may be represented by the general formula:

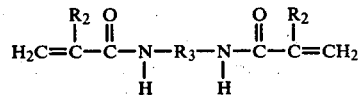

wherein $R_2$ is —H or —$CH_3$ and $R_3$ is an alkylene derivative radical of from one to ten carbon atoms.

Other suitable crosslinking agents include acrylyl and alkacrylyl compounds, e.g., acrylic, haloacrylic, and methacrylic acids, ester, nitriles and amides such as acrylonitrile, methyl methacrylate, ethyl methacrylate, butyl methacrylate, octyl methacrylate, cyclohexyl methacrylate, methoxymethyl methacrylate, chloroethyl methacrylate, methacrylic acid, ethylacrylate, calcium acrylate, and alpha chloroacrylic acid and other vinyl derivatives including vinyl pyrrolidone.

The initiators contemplated herein are oxalic acid and its water-soluble salts. Representative compounds include oxalic acid, sodium oxalate, potassium oxalate, lithium oxalate and urea oxalate. The amount of this compound may vary over a wide range. Generally, however, it has been found that from about 0.01 parts by weight to about 5.0 parts by weight of the polymeric mixtures may be incorporated.

It is preferable to add the photopolymerizable compositions herein disclosed to a support in the form of a mixture or dispersion which dries as a film. Deposition of films or coatings of the photopolymerizable compositions herein disclosed may be carried out according to any known process. They may be either sprayed, whirled, or brushed onto a supporting surface or coated by dipping or by ordinary emulsion coating techniques, and the coating then dried and exposed to light through a transparency or master negative and thereafter finally washed with a developing solution such as water. The image is generally delicate when wet, but on drying becomes very durable and may be left in this form or may be protected with a lacquer coating. Suitable basis or substrates are metal sheets such as copper, aluminum, zinc, magnesium, glass, cellulose, polyvinyl acetate films, polystyrene films, polyethylene terephthalate, and the like.

After the support member or substrate has been coated with a film of the photopolymerizable compositions herein disclosed, they may be dried and then exposed to light as herein described, preferably ultraviolet light although a wide range of different light sources may be used. The exposure to such light brings about polymerization of the compositions herein disclosed by producing crosslinking of the various double bonds of the polymeric materials, and thereby converts the polymer from one with which is soluble to one which is insoluble in water. Such crosslinking also makes the polymer stronger and more resistant to acids, alkali and solvents. The duration of the exposure is, of course, widely veritable depending upon the intensity of the light source, the precise position of the polymer, the thickness of the film, etc. The exposure will generally be equivalent to about 10 to 20 lux units at 3,000 ft., candles. The unexposed area will, of course, remain soluble thereby enabling the image to be developed. The exposed support and polymer film is washed with water to remove the nonexposed areas.

If desired, various plasticizers may be admixed with the present compositions defined herein to afford and facilitate flexibility and toughness as needed. Although a wide range of plasticizers are known, the water-miscible esters have been found most suitable. Illustrative of the plasticizers is dibutyl sebacate tricresyl phosphate, diethyl phosphate, etc. Generally, the amount of plasticizer may very over a wide range depending on the desired product, however, amounts from about 0.5 percent to about 5 percent in the polymer render very suitable compositions.

There may be included in the photopolymerizable compositions other materials to enhance certain properties and include fillers such as talc, and various pigments, and wellknown compounds which serve as effective accelerators of the photopolymerization by facilitating the formation of crosslinkages.

It has been found that the compositions of the subject invention are quite stable if stored away from strong actinic light. Further, it may be desirable to include a small quantity of a polymerization inhibitor sufficient to maintain the stability of the polymer, but insufficient to prevent or materially effect the polymerization when the composition is later exposed to the actinic light.

Printing plates prepared from the compositions of this invention are characterized by improved ink receptivity, by the retention of such ink receptivity even after long continued use. The compositions herein are also considerably more resistant both to water and to acids than films prepared from conventional compositions and are characterized by greater durability and superior printing qualities.

The present invention is further illustrated in greater detail by the following examples, but it is to be understood that the present invention in its broadest aspects, is not necessarily limited to said examples.

EXAMPLE I

One hundred parts of vinyl acetate emulsion having about 55 percent solids were placed in a blender, whereupon about 4.5 parts of polyvinyl alcohol were added thereto with constant stirring. After the polyvinyl alcohol was dissolved and thoroughly mixed in the polyvinyl acetate emulsion about 4.0 parts of N,N'-methylene bisacrylamide were added with constant stirring. Thereafter, about 0.8 parts of potassium oxalate were added thereto. This emulsion mixture was stirred for about 10 minutes to insure a good dispersion.

The above mixture was then coated on a grained aluminum plate and dried overnight at about room temperature, the dried thickness being about 25 mils. The coated plate was then exposed to ultraviolet light (5 KW Douhitt Unit) through a master negative for about four minutes. The exposed plate was thereafter exposed to a fine water spray which washed away the unexposed areas thus leaving a relief image. An oil-base ink was applied to the printing plate and pressed against a paper surface where upon a relief image was transferred to the paper surface. An excellent reproduction was achieved.

EXAMPLE II

A photopolymerizable composition was prepared by mixing 100 parts of polyvinyl acetate emulsion having about 55 percent solids in a blender, mixing therewith about 4.0 parts polyvinyl alcohol being about 88 percent hydrolyzed under constant stirring. After the polyvinyl alcohol was thoroughly dissolved, about 4.0 parts acrylamide were added and mixed thoroughly until it was dissolved. A small amount of a pyrazolone dye was added to give color to the plate and the mixture stirred until it was dispersed therein. Thereafter, about 0.8 parts potassium oxalate were added and the mixture stirred until dissolved.

The above mixture was then coated on a grained aluminum plate and dried overnight, the dried thickness being about 25 mils. The coated plate was then exposed to ultraviolet light (5 KW Douhitt Unit) through a master negative for approximately fourminutes. The exposed late was thereafter placed in a spray unit and exposed to a fine water spray which washed away the unexposed areas of the plate producing a splended relief image thereon.

EXAMPLE III

About 100 parts of polyvinyl acetate emulsion having about 55 percent solids were placed in a blender and about 4.8 parts polyvinyl alcohol being 88 percent hydrolyzed were thereafter added with constant stirring. After the polyvinyl alcohol was thoroughly dissolved about 2.0 parts N,N'-methylene bisacrylamide were added with constant stirring. This was followed by the addition of about 2.0 parts hydroxyethylacrylate with constant mixing. A small amount about 0.4 parts of a pyrazolone dye were added to the mixture and dispersed therein. Thereafter, about 0.8 parts potassium oxalate were added and stirred thoroughly until the oxalate was thoroughly mixed.

The above mixture was thereafter coated on a grained aluminum plate and dried overnight, the dried film thickness being about 25 mils. The plate was then exposed to ultraviolet light (5 KW Douhitt Unit) through a master negative for approximately four minutes. The plate was then placed in a water spray which washed away all unexposed areas thus producing a well defined relief image thereon.

EXAMPLE IV

About 100 parts polyvinyl acetate emulsion having 55 percent solids were placed in a blender, and about 4.8 parts polyvinyl alcohol were thereafter added with mixing and stirred until dissolved. Thereafter, about 2.0 parts N,N'-methylene bisacrylamide with about 2.0 parts dimethyl-2-hydroxypropylamine methacrylimide were introduced and constantly stirred. Thereafter, about 0.4 parts solution of a one percent pyrazolone dye were added and dispersed therein. About 0.8 parts oxalic acid were thereafter added and the mixture stirred until the acid was dissolved.

The above mixture was then coated on a grained aluminum plate and dried overnight, the dried film thickness being about 25 mils. The plate was then exposed to ultraviolet light (5 KW Douhitt Unit) through a master negative for approximately four minutes. The plate was then placed in a water spray which washed away the unexposed areas, thus producing a fine relief image.

EXAMPLE V

A mixture was produced identical with that as stated in Example IV with the exception that dimethyloxalic was used in place of oxalic acid. The mixture was coated on an aluminum plate as stated in Example IV and exposed and washed rendering an excellent relief image.

EXAMPLE VI

About 100 parts polyvinyl acetate emulsion having about 55 percent solids were placed in a blender and about 4.8 parts polyvinyl pyrollidone were added and thoroughly mixed therein. After the polyvinyl pyrollidone was dissolved about 2.0 parts N,N'-methylene bisacrylamide and about 2.0 parts aminimide were added with constant stirring. About 0.4 parts of a one percent pyrazolone dye (OXONOL 805, Fairmont Chemical Company, N.J.) were added and thoroughly mixed therein. About 0.8 parts oxalic acid were then added and the mixture stirred until the oxalic acid was thorougly dissolved.

The above mixture was then coated on a grained aluminum plate and dried overnight, the dried film thickness being about 25 mils. The plate was then exposed to the ultraviolet light (5 KW Douhitt Unit) through a master negative for about four minutes. The plate was then placed in a water spray which washed away the unexposed areas, thus producing an excellent relief image.

EXAMPLE VII

Example VI was repeated with the exception that urea oxalate was used in place of the oxalic acid.

It is understood that the invention is not restricted to any of the specific examples disclosed herein above but includes all such variations, modifications, or equivalents within the scope of the appended claims.

We claim:

1. A photopolymerizable composition consisting of an aqueous mixture of a water-insoluble resin, a water-soluble binder, a crosslinking agent, and a photopolymerization initiator selected from the group consisting of oxalic acid, sodium oxalate, potassium oxalate, lithium oxalate and urea oxalate.

2. A photopolymerizable composition as recited in claim 1 wherein the water-insoluble resin is a member selected from the group consisting of polyvinyl acetate, polyvinyl acrylate, polyvinyl methacrylate, polyvinyl acetate-acrylate, polyterpene, polystyrene and mixtures thereof.

3. A photopolymerizable composition as recited in claim 1 wherein the water-soluble binder is a member selected from the group consisting of polyvinyl alcohol, polyvinyl pyrrolidone, carboxylmethyl cellulose, polyacrylamide, alginate salts, gelatin and mixtures thereof.

4. A photopolymerizable composition as recited in claim 1 wherein the crosslinking agent is a member selected from the group consisting of aminimide, acrylamide acrylyl and alkacrylyl compounds.

5. A composition as recited in claim 4 wherein the crosslinking agent is acrylamide or methylacrylamide.

6. A composition as recited in claim 4 wherein the aminimide is represented by the general formula:

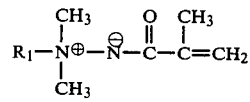

wherein $R_1$ is a radical selected from the group consisting of $-CH_3$, $-CH_2-CH(OH)CH_3$, $-CH_2CH(OH)CH_2OH$, $-CH_2CH(OH)(CH_2)_5CH_3$, and $-CH_2CH(OH)(CH_2)_7CH_3$.

7. A composition as recited in claim 4 wherein the acrylamide is represented by the general formula:

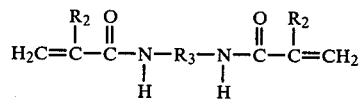

wherein $R_2$ is hydrogen or methyl and $R_3$ is an alkylene group having one to ten carbon atoms.

8. A photopolymerizable composition consisting of an aqueous mixture of a water-insoluble resin, a water-soluble binder, a photopolymerization initiator selected from the group consisting of oxalic acid, sodium oxalate, potassium oxalate, lithium oxalate and urea oxalate, and a crosslinking agent selected from the group consisting of

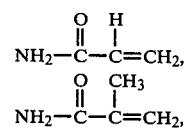

-continued

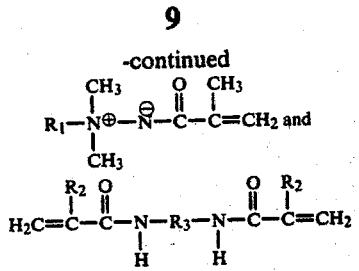

wherein $R_1$ is a radical selected from the group consisting $-CH_3$, $-CH_2-CH(OH)CH_3$, $-CH_2CH(OH)CH_2OH$, $-CH_2CH(OH)(CH_2)_5CH_3$, and $-CH_2CH(OH)(CH_2)_7CH_3$, and $R_2$ is a member selected from the group consisting of hydrogen and methyl.

9. A composition as recited in accordance of claim 8 wherein the amount of said photopolymerization initiator is between about 0.01 and about 5.0 parts by weight of the total polymeric mixture.

* * * * *